US008999820B2

(12) United States Patent
Byun et al.

(10) Patent No.: US 8,999,820 B2
(45) Date of Patent: Apr. 7, 2015

(54) FABRICATING METHOD OF CARBON NANOTUBE-BASED FIELD EFFECT TRANSISTOR AND CARBON NANOTUBE-BASED FIELD EFFECT TRANSISTOR FABRICATED THEREBY

(71) Applicant: Korea Institute of Science and Technology, Seoul (KR)

(72) Inventors: Young Tae Byun, Gyeonggi-do (KR); Sun Ho Kim, Seoul (KR); Young Min Jhon, Seoul (KR); Eun Gyeong Kim, Chungcheongnam-do (KR); Jae Seong Kim, Gyeonggi-do (KR); Deok Ha Woo, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 0 days.

(21) Appl. No.: 14/048,197

(22) Filed: Oct. 8, 2013

(65) Prior Publication Data

US 2014/0367632 A1 Dec. 18, 2014

(30) Foreign Application Priority Data

Jun. 12, 2013 (KR) .................. 10-2013-0067285

(51) Int. Cl.
*H01L 21/20* (2006.01)
*H01L 51/00* (2006.01)
*H01L 51/05* (2006.01)

(52) U.S. Cl.
CPC ........ *H01L 51/0003* (2013.01); *H01L 51/0048* (2013.01); *H01L 51/0508* (2013.01); *Y10S 977/742* (2013.01)

(58) Field of Classification Search
CPC ............................ B82Y 40/00; H01L 21/20
USPC ........................................... 438/478; 977/742
See application file for complete search history.

(56) References Cited

U.S. PATENT DOCUMENTS

| | | | |
|---|---|---|---|
| 7,413,971 B2* | 8/2008 | Steinhogl et al. | 438/597 |
| 7,682,973 B2* | 3/2010 | Kim et al. | 438/680 |
| 7,687,981 B2* | 3/2010 | Parsapour | 313/311 |
| 2004/0192072 A1* | 9/2004 | Snow et al. | 438/800 |
| 2008/0075954 A1* | 3/2008 | Wardle et al. | 428/339 |
| 2009/0045061 A1* | 2/2009 | Farrow et al. | 204/471 |
| 2009/0057839 A1* | 3/2009 | Lewis et al. | 257/618 |
| 2009/0278556 A1* | 11/2009 | Man et al. | 324/693 |
| 2009/0311166 A1* | 12/2009 | Hart et al. | 423/445 B |
| 2010/0009474 A1* | 1/2010 | Kim et al. | 438/20 |
| 2010/0032197 A1* | 2/2010 | Hong et al. | 174/261 |

(Continued)

*Primary Examiner* — Caleb Henry
(74) *Attorney, Agent, or Firm* — Ladas & Parry LLP (57) ABSTRACT

There are provided a fabricating method of a carbon nanotube-based field effect transistor having an improved binding force with a substrate and a carbon nanotube-based field effect transistor fabricated by the fabricating method. The method includes forming an oxide film on a substrate, forming a photoresist pattern on the oxide film, forming a metal film on the entire surface of the oxide film having the photoresist pattern, removing the photoresist by lifting off, adsorbing carbon nanotubes on the substrate from which the photoresist is removed, performing an annealing process to the substrate to which the carbon nanotubes are adsorbed, and removing the metal film. Since an adhesive strength between a substrate and carbon nanotubes increases, stability and reliability of a field effect transistor can be improved. If the field effect transistor is applied to a liquid sensor or the like, a lifespan of the sensor can be extended and reliability of a measurement result obtained by the sensor can be improved.

11 Claims, 5 Drawing Sheets

(56) References Cited

U.S. PATENT DOCUMENTS

| | | |
|---|---|---|
| 2010/0035412 A1* | 2/2010 | Samuelson et al. ............ 438/478 |
| 2010/0038625 A1* | 2/2010 | Bertin .............................. 257/9 |
| 2010/0279179 A1* | 11/2010 | Farrow et al. ................. 429/401 |
| 2010/0291486 A1* | 11/2010 | Kim et al. ..................... 430/313 |
| 2010/0295023 A1* | 11/2010 | Franklin et al. ................. 257/24 |
| 2012/0056149 A1* | 3/2012 | Cleavelin et al. ................. 257/9 |
| 2012/0289029 A1* | 11/2012 | Jhon et al. ..................... 438/478 |
| 2014/0313636 A1* | 10/2014 | Tour et al. ..................... 361/502 |

* cited by examiner

Non-annealed sample

FABRICATING METHOD OF CARBON NANOTUBE-BASED FIELD EFFECT TRANSISTOR AND CARBON NANOTUBE-BASED FIELD EFFECT TRANSISTOR FABRICATED THEREBY

CROSS-REFERENCE TO RELATED APPLICATION

This application claims priority to and the benefit of Korean Patent Application No. 2013-0067285, filed on Jun. 12, 2013, the disclosure of which is incorporated herein by reference in its entirety.

BACKGROUND

1. Field of the Invention

The present invention relates to a fabricating method of a carbon nanotube-based field effect transistor having an improved binding force with a substrate and a carbon nanotube-based field effect transistor fabricated by the fabricating method, and more particularly, to a fabricating method of a carbon nanotube-based field effect transistor having an improved binding force with a substrate by introducing an annealing process and a carbon nanotube-based field effect transistor fabricated by the fabricating method.

2. Discussion of Related Art

A carbon nanotube (CNT) is formed in a cylindrical structure in which six carbon atoms are connected to each other in a hexagonal shape. The carbon nanotube has a current density of about 1000 times higher than a copper wire and a carrier mobility of about 10 times higher than silicone, and thus has been widely used as a material of high sensitive/high speed electronic devices. Specifically, it can be applied to various fields such as a field emission device, a flat panel display, electrochemical field, energy storage field, etc.

In particular, when a carbon nanotube is used as a sensor, its sensitivity is very high at normal temperature. However, the carbon nanotube cannot be adsorbed uniformly and hysteresis occurs. In order to remove hysteresis of a carbon nanotube field effect transistor sensor, water molecules between the carbon nanotube and a substrate need to be removed. When there are water molecules, hysteresis occurs and a binding force between the carbon nanotube and the substrate decreases, which may reduce a lifespan of the sensor.

Figure 1:
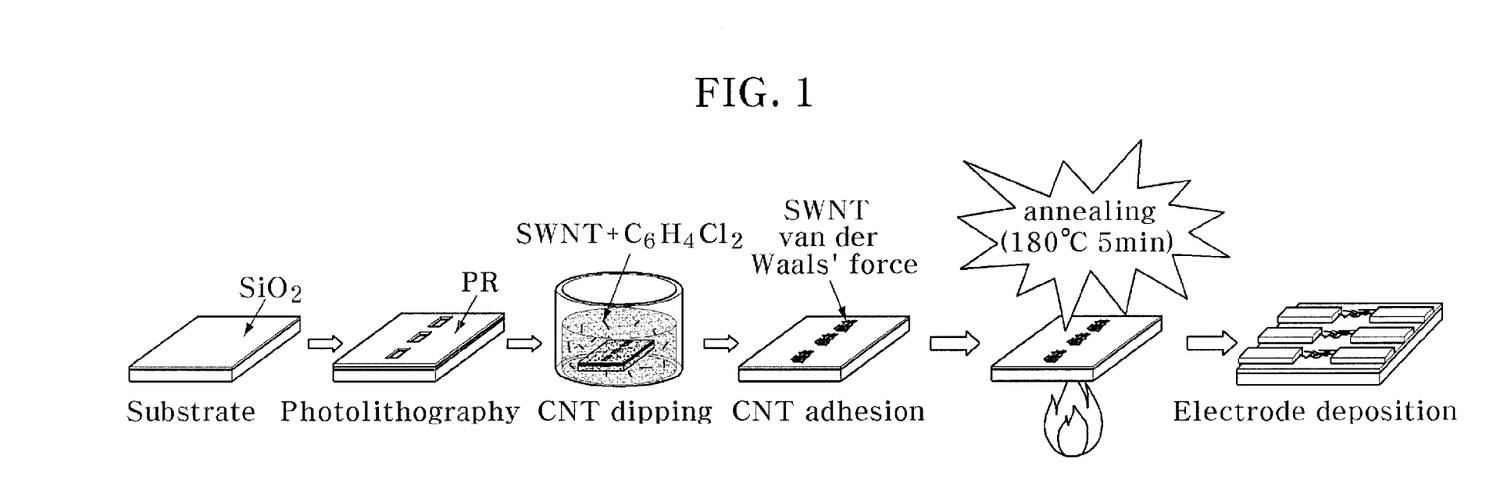
FIG. 1 is a schematic diagram illustrating a carbon nanotube-based sensor fabricating method introducing a conventional annealing process.

In order to solve such problems, an annealing process is introduced. FIG. 1 schematically shows a fabricating method of a carbon nanotube sensor introducing an annealing process. FIG. 2 shows voltage-current characteristics of a sensor fabricated by the fabricating method of FIG. 1.

Referring to FIG. 1, when a photoresist (PR)-patterned sample is dipped in a carbon nanotube (CNT) solution, all the CNTs are adsorbed onto a $SiO_2$ surface and a photoresist (PR) surface. The photoresist (PR) surface has a lower hydrophilic property than that of the $SiO_2$ surface, and thus fewer carbon nanotubes (CNTs) are adsorbed thereto. When the sample adsorbing the CNTs on its entire surface is immersed in an acetone solution to smelt the photoresist (PR) pattern, the carbon nanotubes (CNTs) adsorbed onto the photoresist (PR) surface are also removed. On the other hand, the carbon nanotubes (CNTs) adsorbed onto the $SiO_2$ surface remain on the surface due to a van der Waals' force. Then, the sample from which the photoresist (PR) is removed is washed with methanol, isopropanol, and DI distilled water in sequence and then water on its surface is removed by high-purity nitrogen. During this process, the carbon nanotubes (CNTs) weakly or partially adsorbed onto the surface are desorbed from the surface. Therefore, it is not desirable to carry out an annealing process after the washing process to improve a binding force between a substrate and the carbon nanotubes (CNTs).

In order to solve this problem, an annealing process needs to be carried out right after the carbon nanotubes (CNTs) are adsorbed onto the $SiO_2$ and photoresist (PR) surfaces. However, when the photoresist (PR) is annealed at 120° C. or more, polymers are cross-linked, and thus cannot be removed by acetone later. Therefore, a new process needs to be developed to solve such a problem.

Figure 2A:
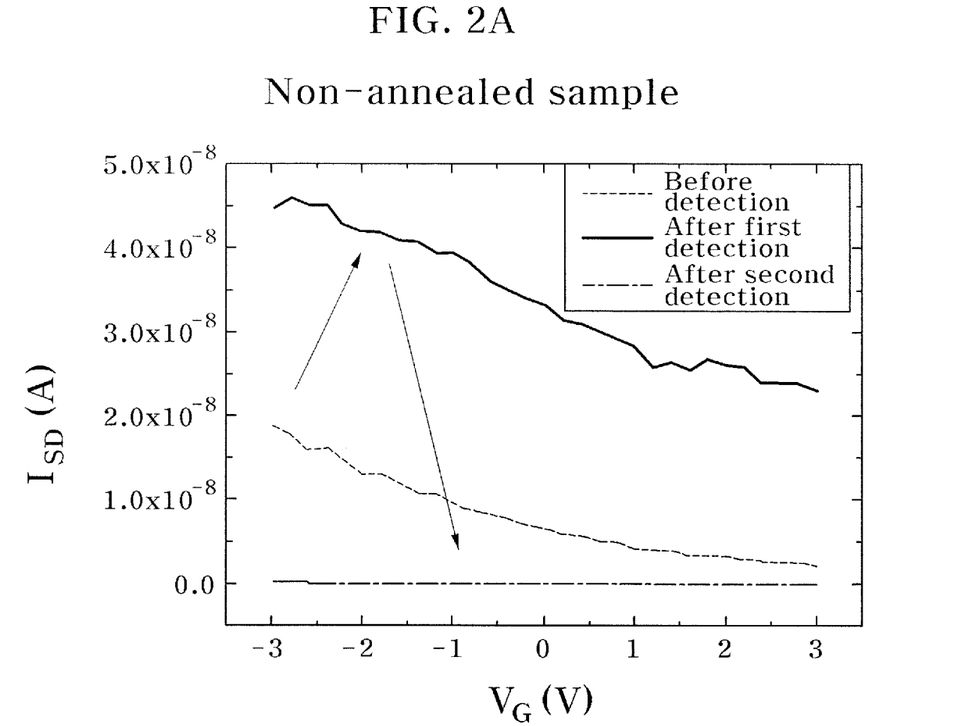
FIG. 2 provides graphs illustrating voltage-current characteristics of (b) a sensor fabricated using an annealing process according to the process of FIG. 1 and (a) a non-annealed sensor after a washing process.

Referring to FIG. 2(a), in case of a non-annealed sample, according to a change in source-drain current ($I_{SD}$) with respect to a gate voltage ($V_G$), (1) before detection, a p-type current-voltage characteristic is shown. (2) When the sample is washed with distilled water after first detection, more currents flow than before the detection. It can be understood that such a result is because a carbon nanotube bundle desorbed from another field effect transistor channel is adsorbed onto a field effect transistor channel under test during the washing process. (3) When the sample is washed with DI distilled water after second detection, a current does not flow. It can be understood that carbon nanotubes adsorbed onto the field effect transistor channel is desorbed during the washing process with the DI distilled water. In conclusion, in order to wash and repeatedly use a liquid sensor, a technology for improving a binding force between carbon nanotubes and a substrate is needed.

Figure 2B:
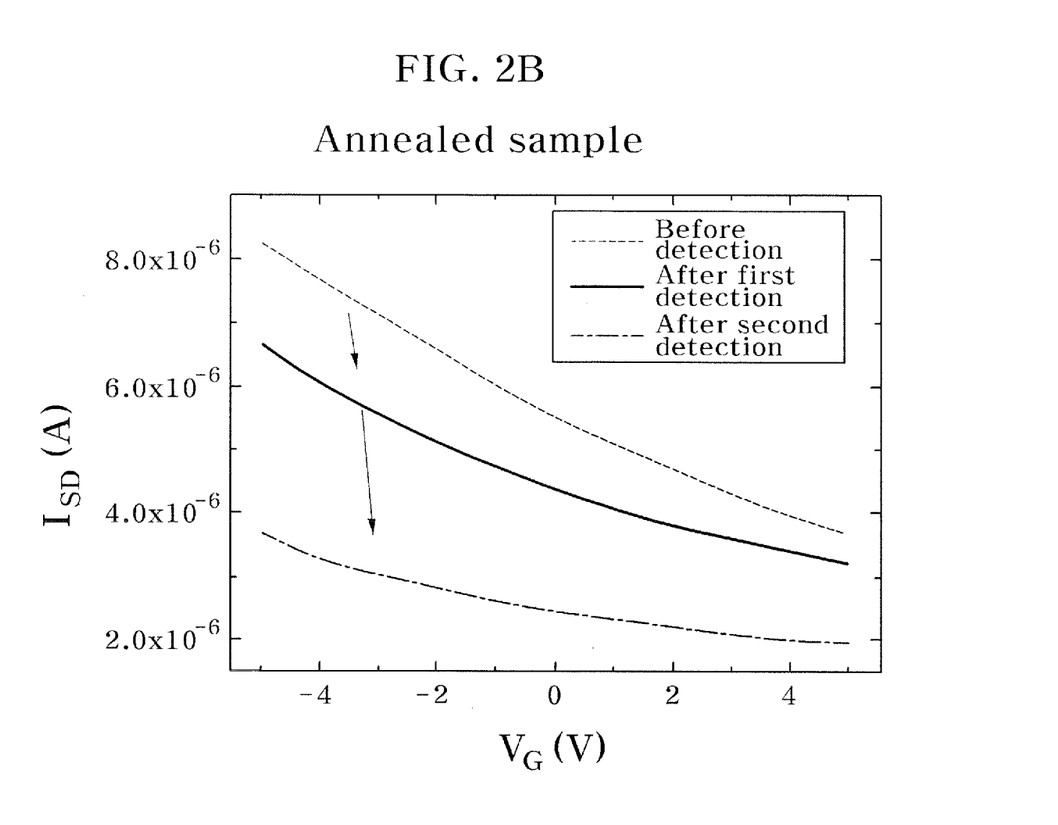

Referring to FIG. 2(b), in case of an annealed sample, according to a change in source-drain current ($I_{SD}$) with respect to a gate voltage ($V_G$), a p-type semiconductor characteristic is shown. (1) Before detection, (2) when the sample is washed with distilled water after first detection, and (3) when the sample is washed with distilled water after second detection, a p-type current-voltage characteristic is shown. However, it can be seen that as the number of washing processes is increased, a current level decreases. In conclusion, in order to wash and repeatedly use a liquid sensor, a technology for improving a binding force between carbon nanotubes and a substrate is needed.

SUMMARY OF THE INVENTION

The present invention is directed to a fabricating method of a carbon nanotube-based field effect transistor having an excellent binding force with a substrate, and a carbon nanotube-based field effect transistor fabricated by the fabricating method.

According to an aspect of the present invention, there is provided a fabricating method of a carbon nanotube-based field effect transistor, including: forming an oxide film on a substrate; forming a photoresist pattern on the oxide film; forming a metal film on the entire surface of the oxide film having the photoresist pattern; removing the photoresist by lifting off; adsorbing carbon nanotubes; performing an annealing process to the substrate to which the carbon nanotubes are adsorbed; and removing the metal film.

The substrate may include a silicon wafer and the oxide film may contain $SiO_2$.

Photoresist patterning may be carried out by a photolithography process.

The metal film may contain titanium.

The metal film may be formed by thermal evaporation, e-beam evaporation, sputtering, or atomic layer deposition.

The carbon nanotubes may include single-walled carbon nanotubes.

The adsorbing of the carbon nanotubes may be carried out by dipping the substrate from which the photoresist is removed in a carbon nanotube dispersed solution.

The carbon nanotube dispersed solution may include one or more solvents selected from the group consisting of dichlorobenzene (DCB), ortho-dichlorobenzene (o-DCB), N-methyl-2-pyrrolidinone (NMP), hexamethylphosphoramide (HMPA), monochlorobenzene (MCB), N,N-dimethylformamide (DMF), dichloroethane (DCE), isopropyl alcohol (IPA), ethanol, chloroform, and toluene.

The annealing process may be carried out at a temperature higher than a boiling point of the solvent.

The removing of the metal film may be carried out by removing the metal film through an etching process.

According to another aspect of the present invention, there is provided a fabricating method of a carbon nanotube-based field effect transistor, including: forming an oxide film on a substrate; adsorbing or applying carbon nanotubes on the oxide film; performing an annealing process to the substrate to which carbon nanotubes are adsorbed or applied; forming a photoresist pattern on the annealed substrate; performing an oxygen plasma process to the substrate having the photoresist pattern; and removing the photoresist.

The substrate may include a silicon wafer and the oxide film may contain $SiO_2$.

The carbon nanotubes may include single-walled carbon nanotubes.

The adsorbing of the carbon nanotubes may be carried out by adsorbing or applying a carbon nanotube dispersed solution onto the oxide film.

The carbon nanotube dispersed solution may be applied by a spin coating method.

The carbon nanotube dispersed solution may include one or more solvents selected from the group consisting of dichlorobenzene (DCB), ortho-dichlorobenzene (o-DCB), N-methyl-2-pyrrolidinone (NMP), hexamethylphosphoramide (HMPA), monochlorobenzene (MCB), N,N-dimethylformamide (DMF), di chloroethane (DCE), isopropyl alcohol (IPA), ethanol, chloroform, and toluene.

The annealing process may be carried out at a temperature higher than a boiling point of the solvent.

Photoresist patterning may be carried out by a photolithography process.

The oxygen plasma process may be carried out at an oxygen partial pressure of 300 mTorr at 100 watt for 50 seconds.

According to still another aspect of the present invention, there is provided a carbon nanotube-based field effect transistor fabricated by the above-described aspects.

BRIEF DESCRIPTION OF THE DRAWINGS

The above and other objects, features, and advantages of the present invention will become more apparent to those of ordinary skill in the art by describing in detail exemplary embodiments thereof with reference to the accompanying drawings, in which.

DETAILED DESCRIPTION OF EXEMPLARY EMBODIMENTS

Hereinafter, exemplary embodiments of the present invention will be described in detail with reference to the accompanying drawings. The exemplary embodiments can be changed and modified in various ways, and the scope of the present invention is not limited to the exemplary embodiments explained below. Further, the exemplary embodiments are provided to more completely explain the present invention to those skilled in the art. Therefore, shapes and sizes of elements shown in the drawings may be exaggerated for the sake of clearer explanation, and like reference numerals denote like parts through the drawings.

Figure 3:
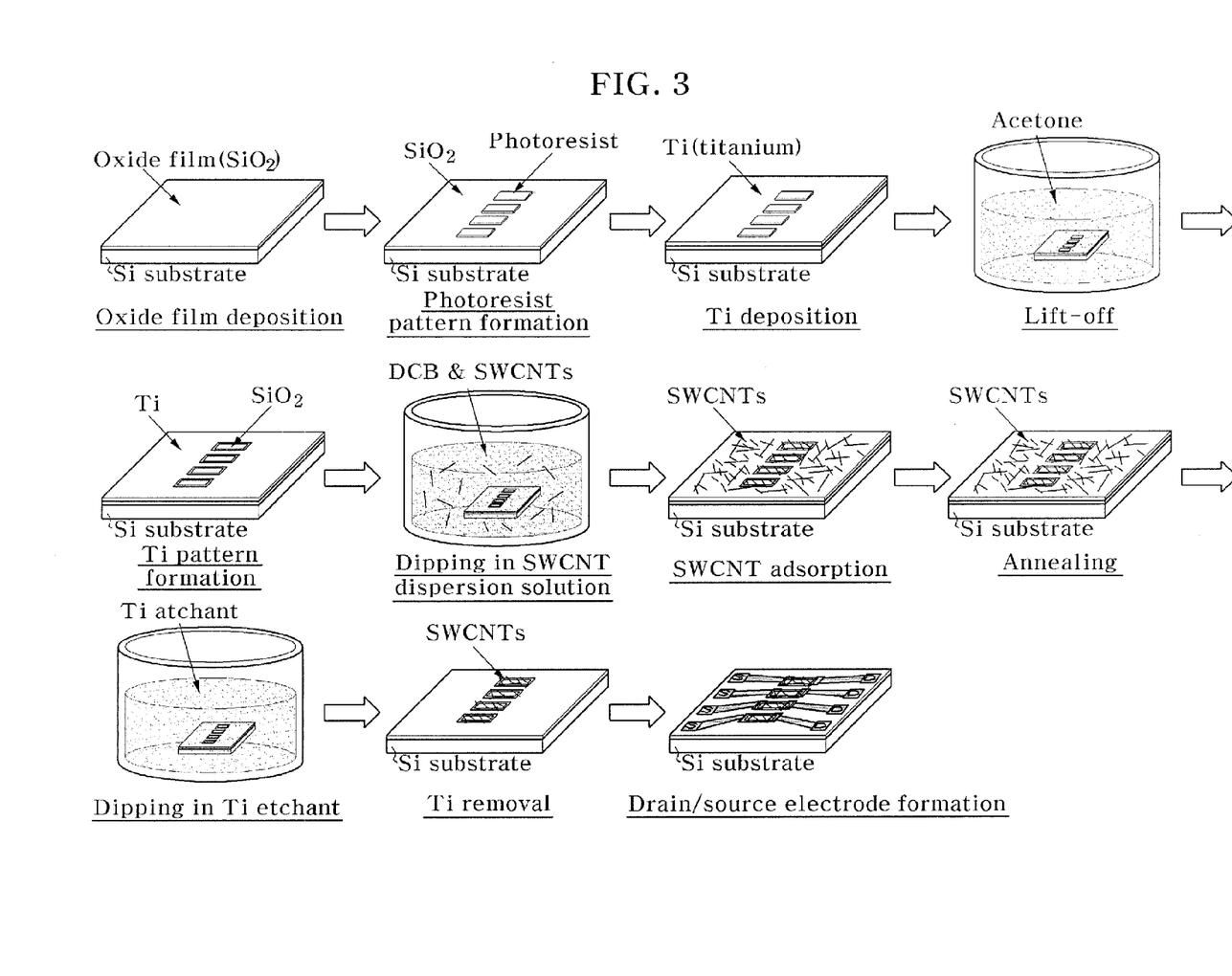
FIG. 3 is a schematic diagram illustrating a flow of a process according to an exemplary embodiment of the present invention.
Figure 4:
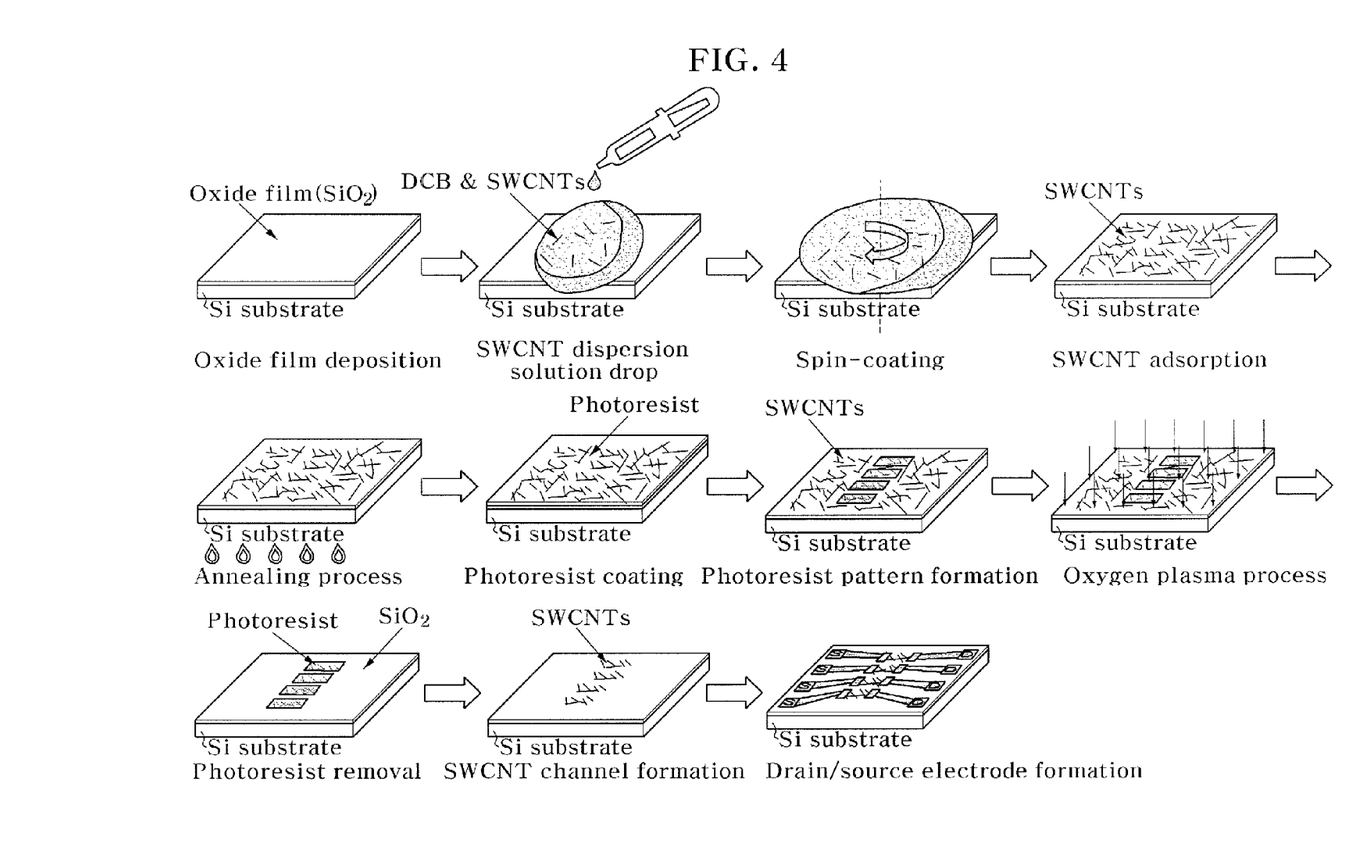
FIG. 4 is a schematic diagram illustrating a flow of a process according to another exemplary embodiment of the present invention.

FIG. 3 is a schematic diagram illustrating a flow of a process according to an exemplary embodiment of the present invention. FIG. 4 is a schematic diagram illustrating a flow of a process according to another exemplary embodiment of the present invention.

Referring to FIG. 3, an exemplary embodiment of the present invention provides a fabricating method of a carbon nanotube-based field effect transistor, including: forming an oxide film on a substrate; forming a photoresist pattern on the oxide film; forming a metal film on the entire surface of a sample having a photoresist pattern; removing the photoresist by lifting off; adsorbing carbon nanotubes at an $SiO_2$ region where the photoresist is removed; performing an annealing process to the substrate to which the carbon nanotubes are adsorbed; and removing the metal film.

First of all, an oxide film may be formed on a substrate. The substrate may include a III-V compound semiconductor such as a Si, GaAs, InP, and InGaAs, glass, a oxide thin film, a dielectric thin film, and a metal thin film. In particular, a silicon wafer may be used as the substrate, and a $SiO_2$ oxide film may be formed on a surface of the silicon wafer. The oxide film may be formed by, but not limited to, a thermal oxidation method, a vapor deposition method, and a spin coating method. According to the thermal oxidation method, a thermal oxide film may be formed using a thermal diffusion path and annealing at a temperature of 1000° C. or more. According to the vapor deposition method, a $SiO_2$ thin film may be formed by means of Plasma-Enhanced Chemical Vapor Deposition (PECVD) or Low-Pressure Chemical Vapor Deposition (LPCVD). According to the spin coating method, a $SiO_2$ thin film can be formed on a silicon wafer using Silica-On-Glass (SOG). A thickness of the oxide film may be in a range of 120 to 300 nm.

Then, a photoresist pattern may be formed on the oxide film. The photoresist pattern may be formed at a region to adsorb carbon nanotubes later. Photoresist patterning may be carried out by a photolithography process. In other words, the entire surface of the oxide film is applied with a photoresist and an exposure process and a development process are performed thereto, and then, the photoresist may be removed using acetone or a photoresist removing solution (PR remover) from all regions except the region to adsorb carbon nanotubes later.

Thereafter, a metal film may be formed on the entire surface of a sample including the photoresist pattern and the oxide film region. The metal film may include one or more selected from the group consisting of titanium (Ti), nickel (Ni), aluminum (Al), chrome (Cr), tungsten (W), platinum (Pt), gold (Au), silver (Ag), copper (Cu), indium (In), and alloys thereof. The metal film may be formed on the sample by thermal evaporation, e-beam evaporation, sputtering, atomic layer deposition, or the like. After this process, the oxide film may be covered with the photoresist pattern and the metal film.

Then, the photoresist may be removed by means of a lift-off process. Specifically, the photoresist can be removed using acetone or a photoresist removing solution (PR remover). At the regions from which the photoresist is removed, the oxide film ($SiO_2$) may be exposed to the outside.

Thereafter, carbon nanotubes may be adsorbed. Adsorption of the carbon nanotubes may be carried out by dipping the substrate from which the photoresist is removed in a carbon nanotube dispersed solution. The carbon nanotube dispersed solution may include one or more solvents selected from the group consisting of dichlorobenzene (DCB), ortho-dichlorobenzene (o-DCB), N-methyl-2-pyrrolidinone (NMP), hexamethylphosphoramide (HMPA), monochlorobenzene (MCB), N,N-dimethylformamide (DMF), dichloroethane (DCE), isopropyl alcohol (IPA), ethanol, chloroform, and toluene.

A carbon nanotube is formed by rolling a graphite sheet of a hexagonal honeycomb structure into a straw shape and may be categorized as a single-walled carbon nanotube, a double-walled carbon nanotube, or a multi-walled carbon nanotube. The carbon nanotube may electrically have conductive characteristics or semiconductive characteristics depending on a rolling direction. It is desirable to use the single-walled carbon nanotube (SWCNT) among the carbon nanotubes since the single-walled carbon nanotube is excellent in terms of sensitivity and a reaction rate as compared with the multi-walled carbon nanotube. Although only the carbon nanotube is described in the present exemplary embodiment, other carbon nanostructures such as graphene and graphite may be used. The carbon nanostructures may be formed on a polymer substrate into various dimensional carbon structures, that is, a 1-dimensional multi-walled carbon nanotube, 2-dimensional single-walled graphene, a 2.5-dimensional graphene nanoplate, and a 3-dimensional graphite structure using polydimethylsiloxane.

The carbon nanotubes may be adsorbed by a dipping method. In other words, the carbon nanotubes may be adsorbed by dipping the annealed substrate in the carbon nanotube dispersed solution, and in this case, the carbon nanotubes may be adsorbed onto a surface of the substrate by means of self-assembly.

A concentration of the carbon nanotubes in the carbon nanotube dispersed solution may be in a range of 0.01 to 0.50 mg/ml. When the concentration is lower than 0.01 mg/ml, an amount of the carbon nanotubes adsorbed is too small, and thus it cannot well function as a sensor. When the concentration is higher than 0.50 mg/ml, it takes a long time to disperse the carbon nanotubes, sensitivity of a sensor is deteriorated, and an amount of the carbon nanotubes consumed is more than necessary, which may cause an increase in manufacturing costs.

During first dipping, the substrate may be dipped in the carbon nanotube dispersed solution for 5 to 10 seconds and this may be repeated 5 to 15 times. When a dipping time is short or the number of times of dipping is small, an amount of the carbon nanotubes adsorbed is too small, and thus it cannot well function as a sensor. When a dipping time is long or the number of times of dipping is great, a processing time may be increased, resulting in deterioration of productivity. By appropriately adjusting the dipping time and the number of times of dipping, optimum conditions may be obtained.

Through this process, the carbon nanotubes are adsorbed to surfaces of the oxide film and the metal film. Since the oxide film and the metal film have different surface properties, amounts of the carbon nanotubes adsorbed may be different from each other.

Then, the substrate to which the carbon nanotubes are adsorbed may be annealed. By performing an annealing process to the substrate to which the carbon nanotubes are adsorbed, an adhesive strength between the substrate and the carbon nanotubes may be improved. When the substrate to which the carbon nanotubes are adsorbed is annealed at a temperature higher than a boiling point of the solvent, a trace of the solvent remaining between the substrate and the carbon nanotubes is removed and thus the adhesive strength between the carbon nanotubes and the substrate is improved, and after the annealing process, the adhesive strength with respect to the substrate is increased due to crystallization of the carbon nanotubes.

The annealing process may be carried out at a temperature higher than a boiling point of the solvent used for the carbon nanotube dispersed solution. At a temperature lower than the boiling point, improvement in adhesive strength between the carbon nanotubes and the substrate may be insignificant. For reference, the boiling point of dichlorobenzene used for the carbon nanotube dispersed solution is 179° C. The annealing process may be carried out in an atmospheric atmosphere.

The present exemplary embodiment is characterized in that the high-temperature annealing process may be carried out to the substrate to which the carbon nanotubes are adsorbed after the metal film is formed instead of the photoresist. According to a conventional method in which an annealing process is carried out to a substrate on which a photoresist is present, the photoresist cannot be removed later even using acetone, or the like. However, according to the present invention, the annealing process is carried out to the substrate on which the photoresist is not present, and thus a problem caused in the conventional method docs not occur and the adhesive strength between the carbon nanotubes and the substrate can be improved.

Further, when the annealing process is carried out to the substrate on which the metal film is present, the carbon nanotubes in a more amount may remain as being adsorbed as compared with a case where the annealing process is carried out to the substrate from which the metal film is removed. The carbon nanotubes are subject to desorption during the process of removing the metal film. Prior to such a process, the annealing process is carried out to improve the adhesive strength with respect to the substrate, so that the carbon nanotubes in a relatively more amount can be adsorbed.

Thereafter, the metal film may be removed through an etching process. A composition of an etchant, an etching temperature, an etching time, and the like may vary depending on elements constituting the metal film. When titanium is used, an etchant may contain $HF:H_2O$ (1:9) or $HNO_3:HF:H_2O$ (2:1:7), an etching temperature may be normal temperature, and an etching time varies depending on a thickness of the metal film.

Before the present process is carried out, the carbon nanotubes are adsorbed onto the metal film and the oxide film ($SiO_2$), but after the present process is carried out, the carbon nanotubes adsorbed onto the metal film are removed at the same time when the metal film is etched. Therefore, only a carbon nanotube pattern may remain on the oxide film.

Additionally, a field effect transistor may be fabricated by forming a source electrode and a drain electrode. Methods for forming a source electrode, a drain electrode, and a gate electrode may be employed from those generally known in the art.

Another exemplary embodiment of the present invention provides a fabricating method of a carbon nanotube-based field effect transistor, including: forming an oxide film on a substrate; adsorbing carbon nanotubes on the oxide film; performing an annealing process to the substrate to which carbon nanotubes are adsorbed; forming a photoresist pattern on the annealed substrate; performing an oxygen plasma process to the substrate having the photoresist pattern; and removing the photoresist.

First of all, an oxide film may be formed on a substrate. The substrate may include a silicon wafer, and the oxide film may include $SiO_2$.

Then, carbon nanotubes may be adsorbed or applied onto the oxide film. The carbon nanotubes may include single-walled carbon nanotubes. The adsorbing of the carbon nanotubes may be carried out by dipping the substrate including the oxide film in a carbon nanotube dispersed solution. Further, the applying of the carbon nanotubes may be carried out by applying the carbon nanotube dispersed solution on the oxide film. The carbon nanotube dispersed solution may be applied by a spin coating method. The carbon nanotube dispersed solution may include one or more solvents selected from the group consisting of dichlorobenzene (DCB), ortho-dichlorobenzene (o-DCB). N-methyl-2-pyrrolidinone (NMP), monochlorobenzene (MCB), hexamethylphosphoramide (HMPA), N,N-dimethylformamide (DMF), dichloroethane (DCE), isopropyl alcohol (IPA), ethanol, chloroform, and toluene. After this process, the carbon nanotubes may be adsorbed onto the entire surface of the oxide film.

Then, the substrate to which the carbon nanotubes are adsorbed may be annealed. The annealing process may be carried out at a temperature higher than a boiling point of the solvent used for the carbon nanotube dispersed solution. The present exemplary embodiment is characterized in that the annealing process can be carried out to the substrate before a photoresist pattern is formed. In the same manner as the foregoing exemplary embodiment, the present exemplary embodiment is characterized in that the annealing process is carried out to the substrate on which a photoresist is not present so as to improve an adhesive strength between the substrate and the carbon nanotubes and then other processes are carried out. Therefore, as compared with a case where a photoresist pattern is formed and an oxygen plasma process is carried out without improvement in adhesive strength between the carbon nanotubes and the substrate, the carbon nanotubes in a more amount may be adsorbed onto the substrate. Through this process, the adhesive strength between the oxide film (substrate) and the carbon nanotubes adsorbed onto the entire surface of the oxide film may be improved.

Thereafter, a photoresist pattern may be formed on the annealed substrate by a photolithography process. The photoresist pattern may be formed by applying a photoresist onto the entire surface of the substrate to which the carbon nanotubes are adsorbed, and removing the photoresist from all regions except a region to be used as a carbon nanotube channel later through an exposure process and a development process. After this process, the carbon nanotubes may be adsorbed on the oxide film (substrate) and the photoresist pattern may be formed at a part thereof.

Then, an oxygen plasma process may be carried out onto the substrate having the photoresist pattern. The oxygen plasma process may be carried out at an oxygen partial pressure of 300 mTorr at 100 watt for 50 seconds. Through the oxygen plasma process, the carbon nanotubes present on the other regions than a photoresist region may be removed. After this process, on the oxide film (substrate), at the region where the photoresist pattern is present, the adsorbed carbon nanotubes may be present between the oxide film and a photoresist layer.

Thereafter, the photoresist may be removed through an etching process. When the photoresist layer is removed using acetone or the like, the carbon nanotubes present under the photoresist layer may be exposed, which may be used as a carbon nanotube channel.

Additionally, a field effect transistor may be fabricated by forming a source electrode and a drain electrode. Methods for forming a source electrode and a drain electrode may be employed from those generally known in the art. The field effect transistor thus fabricated may be used as a sensor, and particularly, as a liquid sensor.

According to the present invention, since an adhesive strength between a substrate and carbon nanotubes increases, stability and reliability of a field effect transistor can be improved. When the field effect transistor is applied to a liquid sensor or the like, a lifespan of the sensor can be extended and reliability of a measurement result obtained by the sensor can be improved.

Further, since a photolithography process is compatible with a semiconductor process, costs can be reduced and mass production can be achieved. Since a liquid process is used, a large-area process can be performed without particularly expensive equipment, and thus costs can be reduced.

The terminology used herein is for the purpose of describing particular embodiments only and is not intended to be limiting of exemplary embodiments. The singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, components, and/or groups thereof, but do not preclude the presence or addition of one or more other features, integers, steps, operations, elements, components, and/or groups thereof. The present invention is not limited by the above-described exemplary embodiments and the accompanying drawings but limited by the accompanying claims. Therefore, various substitutions, changes, and modifications can be made to the above-described exemplary embodiments of the present invention by those skilled in the art without departing from the technical concept of the present invention as described in the claims, and all such substitutions, changes, and modifications provided come within the scope of the present invention.

What is claimed is:

1. A fabricating method of a carbon nanotube-based field effect transistor, the fabricating method comprising:
   forming an oxide film on a substrate;
   forming a photoresist pattern on the oxide film;
   forming a metal film on the entire surface of a sample having the photoresist pattern;
   removing the photoresist by lifting off;
   adsorbing carbon nanotubes on the substrate from which the photoresist is removed;
   performing an annealing process to the substrate to which the carbon nanotubes are adsorbed; and
   removing the metal film.

2. The fabricating method of claim 1, wherein the substrate includes a silicon wafer and the oxide film includes $SiO_2$.

3. The fabricating method of claim 1, wherein photoresist patterning is carried out by a photolithography process.

4. The fabricating method of claim 1, wherein the metal film includes titanium.

5. The fabricating method of claim 1, wherein the metal film is formed by sputtering, e-beam evaporation, thermal evaporation, or atomic layer deposition method.

6. The fabricating method of claim 1, wherein the carbon nanotubes include single-walled carbon nanotubes.

7. The fabricating method of claim 1, wherein the adsorbing of the carbon nanotubes is carried out by dipping the substrate from which the photoresist is removed in a carbon nanotube dispersed solution.

8. The fabricating method of claim 7, wherein the carbon nanotube dispersed solution includes one or more solvents selected from the group consisting of dichlorobenzene (DCB), ortho-dichlorobenzene (o-DCB), N-methyl-2-pyrrolidinone (NMP), hexamethylphosphoramide (HMPA), monochlorobenzene (MCB), N,N-dimethylformamide (DMF), dichloroethane (DCE), isopropyl alcohol (WA), ethanol, chloroform, and toluene.

9. The fabricating method of claim 8, wherein the annealing process is carried out at a temperature higher than a boiling point of the solvent.

10. The fabricating method of claim 1, wherein the removing of the metal film is carried out by removing the metal film through an etching process.

11. A carbon nanotube-based field effect transistor fabricated according to claim 1.

* * * * *